(12) United States Patent
Lu

(10) Patent No.: US 9,437,438 B2
(45) Date of Patent: Sep. 6, 2016

(54) ELECTROLESS PLATING PROCESS AND TIN-SILVER PLATING SOLUTION THEREIN

(71) Applicant: NATIONAL PINGTUNG UNIVERSITY OF SCIENCE & TECHNOLOGY, Pingtung County (TW)

(72) Inventor: Wei-Hua Lu, Pingtung County (TW)

(73) Assignee: NATIONAL PINGTUNG UNIVERSITY OF SCIENCE & TECHNOLOGY, Pingtung County (TW)

( * ) Notice: Subject to any disclaimer, the term of this patent is extended or adjusted under 35 U.S.C. 154(b) by 0 days.

(21) Appl. No.: 14/797,320

(22) Filed: Jul. 13, 2015

(65) Prior Publication Data
US 2016/0133471 A1 May 12, 2016

(30) Foreign Application Priority Data
Nov. 12, 2014 (TW) .............................. 103139311 A

(51) Int. Cl.
- H01L 21/00 (2006.01)
- H01L 21/288 (2006.01)
- H01L 21/768 (2006.01)
- H01L 21/02 (2006.01)

(52) U.S. Cl.
CPC ....... H01L 21/288 (2013.01); H01L 21/02068 (2013.01); H01L 21/76838 (2013.01)

(58) Field of Classification Search
CPC ..... H01L 24/06; H01L 24/09; H01L 21/288; H01L 21/76838; H01L 21/02068
See application file for complete search history.

(56) References Cited

U.S. PATENT DOCUMENTS

2014/0124928 A1* 5/2014 Lin .................. H01L 24/13
257/738

FOREIGN PATENT DOCUMENTS

CN 102931097 A 2/2013

OTHER PUBLICATIONS

Taiwanese Office Action mailed Feb. 18, 2016 for Taiwanese Patent Application No. 103139311, 5 pages.

* cited by examiner

Primary Examiner — Richard Booth
(74) Attorney, Agent, or Firm — Jackson IPG PLLC; Demian K. Jackson

(57) ABSTRACT

An electroless plating process includes providing a semiconductor substrate which has a substrate and a copper pillar disposed on the substrate; providing a tin-silver plating solution includes 0.1-50 wt % tin and $1\times10^5$-2 wt % silver; and performing a reduction reaction, wherein the semiconductor substrate is disposed in the tin-silver plating solution for making tin and silver of the tin-silver plating solution deposit jointly on the copper pillar surface to form a tin-silver co-deposition layer. The tin-silver co-deposition layer is able to enhance the coupling strength between the copper pillar of the semiconductor substrate and the other semiconductor substrate and is also able to reduce the time and cost of the process performing tin-plating and silver-plating separately.

9 Claims, 5 Drawing Sheets

ELECTROLESS PLATING PROCESS AND TIN-SILVER PLATING SOLUTION THEREIN

FIELD OF THE INVENTION

The present invention relates to an electroless plating process, particularly relates to an electroless plating process capable of reducing process time and cost.

BACKGROUND OF THE INVENTION

In conventional electroless plating process, plating a tin layer onto surface of a copper pillar of a semiconductor substrate for preventing copper oxidation, then plating a silver layer for making the copper pillar is able to connect with the other semiconductor substrate. The time and cost of the process will be relatively higher due to perform tin-plating and silver-plating separately. Besides, the silver layer on the copper pillar of the semiconductor substrate is formed on the tin layer after tin plating process. Therefore, the coupling strength will be weaker when the semiconductor substrate connects with the other semiconductor substrate by the copper pillar.

SUMMARY

The primary object of the present invention is to provide an electroless plating process and a tin-silver plating solution used for performing the electroless plating process. A tin-silver co-deposition layer is formed on surface of a copper pillar of a semiconductor substrate, wherein the tin-silver co-deposition layer is able to enhance the coupling strength between the copper pillar of the semiconductor substrate and the other semiconductor substrate and is able to reduce the time and cost of the electroless plating process performing tin-plating and silver-plating separately.

An electroless plating process of the present invention includes providing a semiconductor substrate having a substrate and at least one copper pillar disposed on the substrate; providing a tin-silver plating solution includes 0.1-50 wt % tin and $1\times10^{-5}$-2 wt % silver; performing a reduction reaction, wherein the semiconductor substrate is disposed in the tin-silver plating solution for making tin and silver of the tin-silver plating solution deposit jointly on the copper pillar to form a tin-silver co-deposition layer. The tin-silver co-deposition layer is able to enhance the coupling strength between the copper pillar of the semiconductor substrate and the other semiconductor substrate and is able to reduce the process time and cost of conventional electroless plating process that perform tin-plating and silver-plating separately.

DETAILED DESCRIPTION OF THE INVENTION

Figure 1:
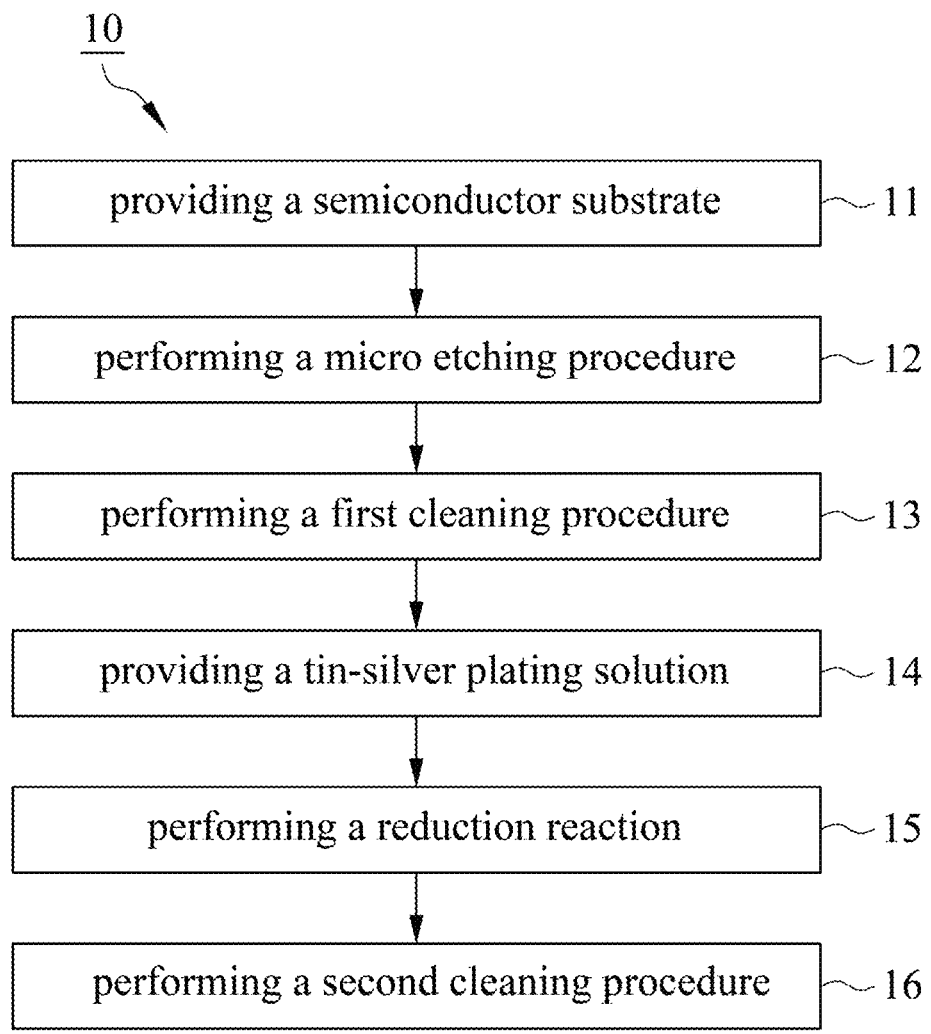
FIG. 1 is a flow chart illustrating an electroless plating process in accordance with an embodiment of the present invention.

With reference to FIG. 1, an electroless plating process 10 in accordance with an embodiment of the present invention includes step 11 of providing a semiconductor substrate, step 12 of performing a micro etching procedure, step 13 of performing a first cleaning procedure, step 14 of providing a tin-silver plating solution, step 15 of performing a reduction reaction and step 16 of performing a second cleaning procedure.

Figure 2:
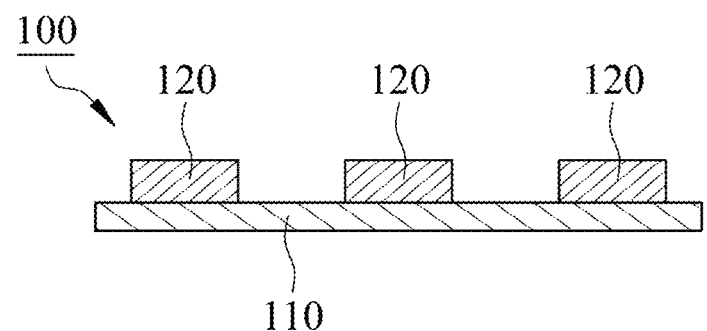
FIGS. 2 to 5 are flow diagrams illustrating the electroless plating process in accordance with the embodiment of the present invention.

With reference to FIGS. 1 and 2, in the step 11 of providing a semiconductor substrate, a semiconductor substrate 100 is provided, wherein the semiconductor substrate 100 has a substrate 110 and at least one copper pillar 120 disposed on the substrate 110.

With reference to FIG. 1, the step 12 of performing a micro etching procedure is performed after the step 11 of providing a semiconductor substrate. The micro etching procedure uses a 1-20 wt % etching solution to micro etch the surface of the copper pillar 120 for 1-5 minutes, wherein the etching solution is used to remove oxides and contaminants on the surface of the copper pillar 120. In this embodiment, the micro etching procedure uses 1 wt % copper sulfate ($CuSo_4$) etching solution to micro etch the surface of the copper pillar 120 for 1 minute.

With reference to FIG. 1, the step 13 of performing a first cleaning procedure is performed after the step 12 of performing a micro etching procedure. The first cleaning procedure uses liquid at 30-60 degrees Celsius to clean the semiconductor substrate 100 for 1-5 minutes, wherein the liquid at 30-60 degrees Celsius is used to remove the etching solution remained on the surface of the copper pillar 120. In this embodiment, the first cleaning procedure uses deionized water at 40 degrees Celsius to clean the semiconductor substrate 100 for 3 minutes.

Figure 3:
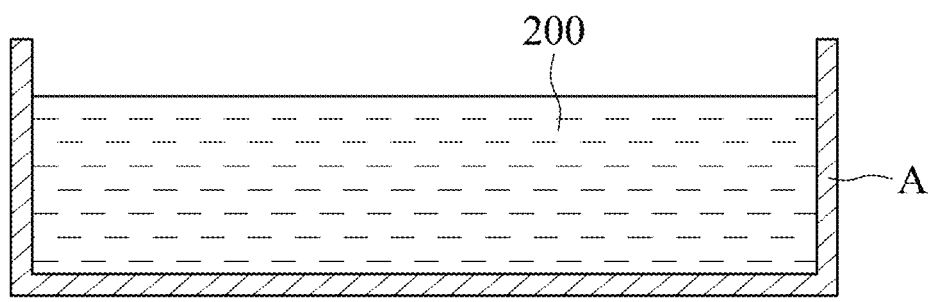

With reference to FIGS. 1 and 3, the step 14 of providing a tin-silver plating solution is performed after the step 13 of performing a first cleaning procedure. A tin-silver plating solution 200 includes 0.1-50 wt % tin and $1\times10^{-5}$-2 wt % silver is provided, and the tin-silver plating solution 200 is disposed in an electroless plating tank A.

Figure 4:
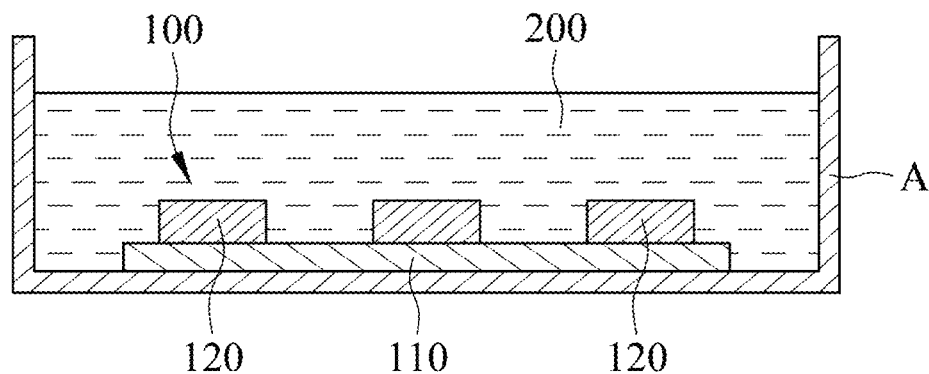
Figure 5:
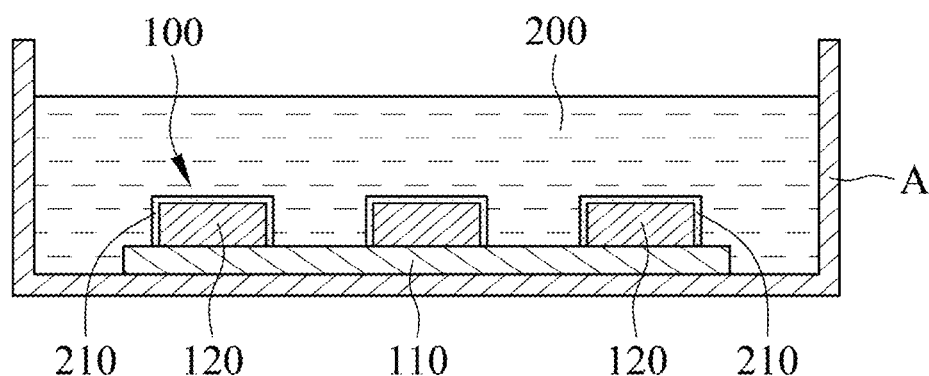

With reference to FIGS. 1, 4 and 5, the step 15 of performing a reduction reaction is performed after the step 14 of providing a tin-silver plating solution. The semiconductor substrate 100 is disposed in the tin-silver plating solution 200 for performing the reduction reaction. The reaction temperature of the reduction reaction is controlled between 40 and 90 degrees Celsius, and the reaction time of the reduction reaction is controlled between 5 and 20 minutes for making tin and silver of the tin-silver plating solution 200 deposit jointly on the surface of the copper pillar 120 to form a tin-silver co-deposition layer 210 (referring to FIG. 6). The tin-silver co-deposition layer 210 is able to enhance the coupling strength between the copper pillar 120 of the semiconductor 100 and the other semiconductor substrate. In this embodiment, the reaction temperature of the reduction reaction is 80 degrees Celsius, and the reaction time of the reduction reaction is 15 minutes.

With reference to FIG. 1, the step 16 of performing a second cleaning procedure is performed after the step 15 of performing a reduction reaction. The second cleaning procedure uses liquid at 30-60 degrees Celsius to clean the semiconductor substrate 100 for 1-5 minutes, wherein the liquid at 30-60 degrees Celsius is used to remove the tin-silver plating solution 200 remained on the surface of the semiconductor substrate 100. In this embodiment, the second cleaning procedure uses deionized water at 40 degrees Celsius to clean the semiconductor substrate 100 for 3 minutes.

Figure 6:
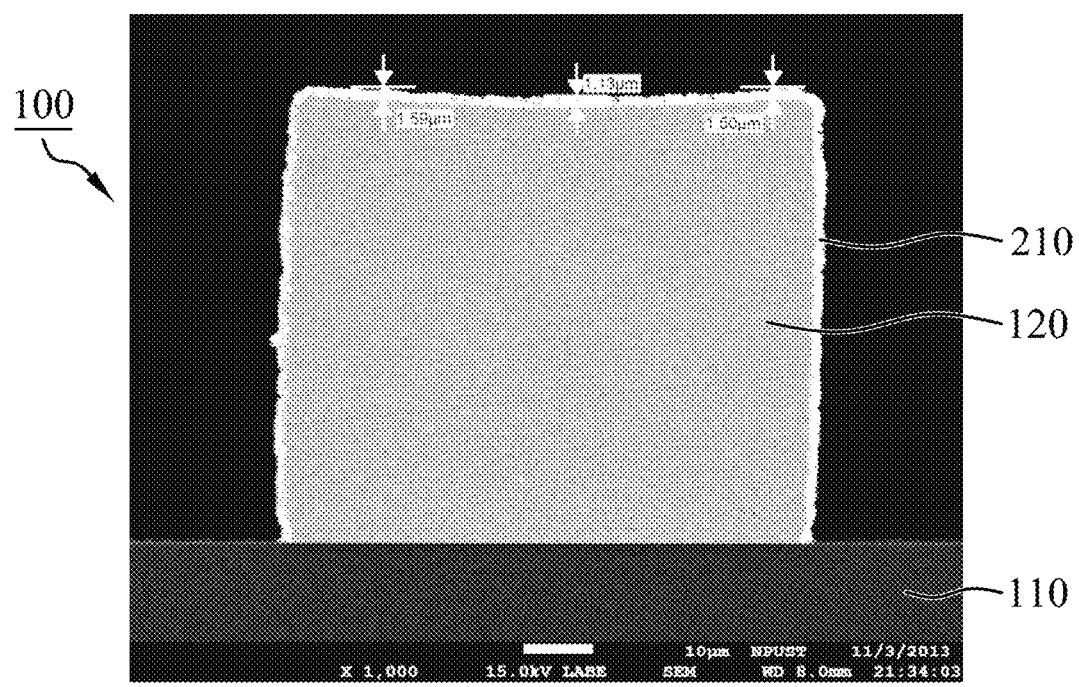
FIG. 6 is an electron microscope image of a lateral surface of a semiconductor substrate in accordance with the embodiment of the present invention.
Figure 7A:
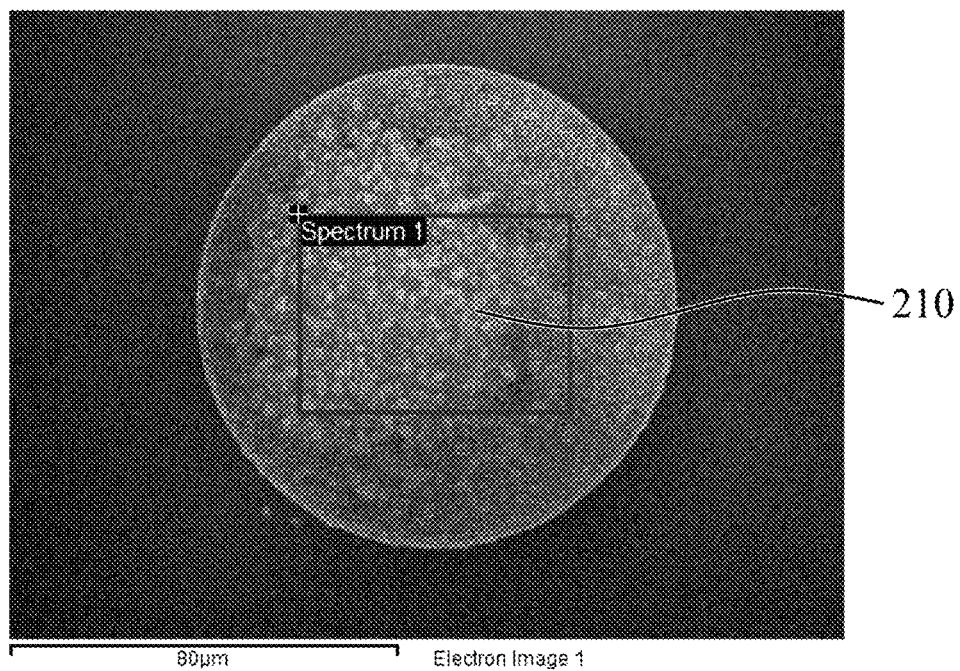
FIGS. 7A and 7B are composition analyzing data of a tin-silver co-deposition layer by using a scanning electron microscope/energy dispersive spectrometer (SEM/EDS).
Figure 7B:
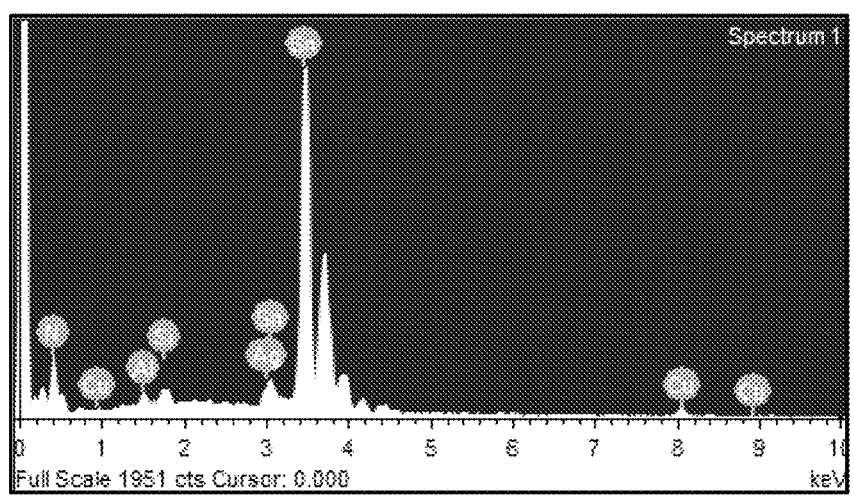

With reference to FIG. 6, an image of a lateral surface of the semiconductor substrate 100 treated with the electroless plating process 10 is captured by a scanning electron microscope (SEM). The surface of the copper pillar 120 forms the tin-silver co-deposition layer 210 after the electroless plating process 10. With reference to FIGS. 7A and 7B, the composition of the tin-silver co-deposition layer 210 is analyzed by the scanning electron microscope/energy dispersive spectrometer (SEM/EDS). The composition of the tin-silver co-deposition layer 210 includes tin (Sn), silver (Ag), copper (Cu), aluminum (Al), silicon (Si) and nitrogen (N), wherein copper (Cu) from the copper pillar 120, aluminum (Al), silicon (Si) and nitrogen (N) from the substrate 110. The composition analysis is able to verify that tin and silver of the tin-silver plating solution 200 is able to form the tin-silver co-deposition layer 210 on the surface of the copper pillar 120.

While this invention has been particularly illustrated and described in detail with respect to the preferred embodiments thereof, it will be clearly understood by those skilled in the art that is not limited to the specific features shown and described and various modified and changed in form and details may be made without departing from the spirit and scope of this invention.

What is claimed is:

1. An electroless plating process includes:
    providing a semiconductor substrate having a substrate and at least one copper pillar disposed on the substrate;
    performing a micro etching procedure using an etching solution having 1-20 wt % solute in reference to a total amount of etching solution used to micro etch the copper pillar surface;
    providing a tin-silver plating solution includes 0.1-50 wt % tin and $1 \times 10^{-5}$-2 wt % silver; and
    performing a reduction reaction, the semiconductor substrate is disposed in the tin-silver plating solution for making tin and silver of the tin-silver plating solution deposit jointly on the copper pillar surface to form a tin-silver co-deposition layer, wherein the tin-silver co-deposition layer is able to enhance the coupling strength between the copper pillar of the semiconductor substrate and another semiconductor substrate.

2. The electroless plating process in accordance with claim 1, wherein the reaction temperature of the reduction reaction is controlled between 40 and 90 degrees Celsius.

3. The electroless plating process in accordance with claim 1, wherein the reaction time of the reduction reaction is controlled between 5 and 20 minutes.

4. The electroless plating process in accordance with claim 1, wherein the time of the micro etching procedure is controlled between 1 and 5 minutes.

5. The electroless plating process in accordance with claim 1 further includes a first cleaning procedure performed after the micro etching procedure, wherein the first cleaning procedure uses liquid at 30-60 degrees Celsius to clean the semiconductor substrate for 1-5 minutes to remove the etching solution remained on the copper pillar surface.

6. The electroless plating process in accordance with claim 1 further includes a second cleaning procedure performed after the reduction reaction, wherein the second cleaning procedure uses liquid at 30-60 degrees Celsius to clean the semiconductor substrate for 1-5 minutes to remove the tin-silver plating solution remained on the semiconductor substrate.

7. An electroless plating process includes:
    providing a semiconductor substrate having a substrate and at least one copper pillar disposed on the substrate;
    providing a tin-silver plating solution includes 0.1-50 wt % tin and $1 \times 10^{-5}$-2 wt % silver;
    performing a reduction reaction, the semiconductor substrate is disposed in the tin-silver plating solution for making tin and silver of the tin-silver plating solution deposit jointly on the copper pillar surface to form a tin-silver co-deposition layer, wherein the tin-silver co-deposition layer is able to enhance the coupling strength between the copper pillar of the semiconductor substrate and another semiconductor substrate; and
    performing a cleaning procedure using liquid at 30-60 degrees Celsius to clean the semiconductor substrate for 1-5 minutes to remove the tin-silver plating solution remained on the semiconductor substrate.

8. The electroless plating process in accordance with claim 7, wherein the reaction temperature of the reduction reaction is controlled between 40 and 90 degrees Celsius.

9. The electroless plating process in accordance with claim 7, wherein the reaction time of the reduction reaction is controlled between 5 and 20 minutes.

* * * * *